(12) United States Patent
Yamaguchi et al.

(10) Patent No.: US 7,011,712 B2
(45) Date of Patent: *Mar. 14, 2006

(54) FIXING STRUCTURES AND SUPPORTING STRUCTURES OF CERAMIC SUSCEPTORS, AND SUPPORTING MEMBERS THEREOF

(75) Inventors: Kazuaki Yamaguchi, Ama-District (JP); Yoshinobu Goto, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 100 days.

This patent is subject to a terminal disclaimer.

(21) Appl. No.: 10/395,536

(22) Filed: Mar. 24, 2003

(65) Prior Publication Data

US 2003/0183340 A1 Oct. 2, 2003

(30) Foreign Application Priority Data

Mar. 28, 2002 (JP) .......................... P2002-092304

(51) Int. Cl.
*H01L 21/00* (2006.01)
*C23C 16/00* (2006.01)
(52) U.S. Cl. .................. 118/725; 118/728; 118/500; 156/345.52; 156/345.51; 219/444.1; 279/128; 361/234; 392/416; 392/418

(58) Field of Classification Search ............... 118/725, 118/728, 500; 156/345.51, 345.52, 345.53; 219/444.1; 392/416, 418; 279/128; 361/234
See application file for complete search history.

(56) References Cited

U.S. PATENT DOCUMENTS

| 6,160,244 A | * | 12/2000 | Ohashi .................... 219/444.1 |
| 6,261,708 B1 | | 7/2001 | Ohashi et al. |
| 2002/0144787 A1 | | 10/2002 | Yamaguchi |

FOREIGN PATENT DOCUMENTS

JP        2001-250858 A        9/2001

* cited by examiner

*Primary Examiner*—Ram N Kackar
(74) *Attorney, Agent, or Firm*—Burr & Brown

(57) ABSTRACT

A supporting structure is provided, including a ceramic susceptor to be heated and having a mounting face and a back face. A ceramic supporting member is joined with the back face of the susceptor. The ceramic supporting member has an outer wall surface, a joining face joined with the susceptor and an end face opposing the joining face. A curved part is formed between the outer wall surface and back face, and has a radius of curvature R in a range of 4 mm to 25 mm in the longitudinal direction of the ceramic supporting member.

16 Claims, 7 Drawing Sheets

FIXING STRUCTURES AND SUPPORTING STRUCTURES OF CERAMIC SUSCEPTORS, AND SUPPORTING MEMBERS THEREOF

This application claims the benefit of Japanese Patent Application P 2002-92304 filed on Mar. 28, 2002, the entirety of which is incorporated by reference.

BACKGROUND OF THE INVENTION

1. Field of the Invention

The present invention relates to a fixing structure of a ceramic susceptor to a chamber, a supporting structure of a ceramic susceptor and a supporting member for the same.

2. Related Art Statement

In a system for producing semiconductors, it is necessary to fix a ceramic susceptor made of, for example, aluminum nitride to the inner wall surface of a chamber. For this, one end of a tubular supporting member made of a ceramics is fixed to a joining face of a ceramic heater and the other end is fixed to the inner wall surface of a chamber. The supporting member is composed of a ceramic plate made of a heat resistant ceramics such as alumina and aluminum nitride. The supporting member and chamber are sealed with an O-ring to secure the air-tightness. It is thus possible to seal the inner space of the supporting member with respect to the inner space of the chamber to secure air-tightness and thereby to prevent the leakage of a gas in the inner space of the chamber to the outside of the chamber.

However, when such cylindrical supporting member is joined with the joining face (back face) of the ceramic heater and the temperature of the heater is elevated, fine cracks may occur along the joining face between the heater and supporting member. Such fine cracks might lead to gas leakage. The assignee filed a Japanese patent application 2000-58,349 (publication 2001-250, 858A) and disclosed to join a supporting member having a shape of bellows to a ceramic heater to solve the above problems.

SUMMARY OF THE INVENTION

The present inventors have studied to develop a design for reducing thermal stress and to prevent crack formation in the joining portion of a ceramic heater and supporting member, under severe condition that the temperature of the heater is elevated from room temperature to a high temperature. In the process, it has been found that an integral and continuous curved part in the outer surface of the joining face of the heater and supporting member may be effective for reducing thermal stress in the joining portion. They have further investigated the detailed design.

The following problems were found, however in some cases, according to the investigation. That is, joining defects might be found in a part, particularly in an outer peripheral part, of the joining portion of the susceptor and supporting member. Such joining defects in the joining portion may lead to crack formation in the joining portion, when the susceptor is heated at a high temperature to induce thermal stress in the joining portion. Articles having such joining defects are treated as off-specification products to reduce the production yield.

An object of the present invention is, in a supporting structure of a ceramic susceptor, to reduce thermal stress in the joining portion of the susceptor and supporting member, and to prevent joining defects in the joining face so that fine cracks or gas leakage in the joining portion may be prevented.

The present invention provides a fixing structure of a ceramic susceptor. The structure has a ceramic susceptor to be heated and having mounting and back faces, a ceramic supporting member joined with the back face of the susceptor, and a chamber fixing the supporting member. The supporting member has an outer wall surface, a joining face joined with the susceptor and an end face opposite to the joining face. A curved part is formed between the outer wall surface and back face, and has a radius of curvature "R" of not smaller than 4 mm and not larger than 25 mm in the longitudinal direction of the supporting member. Furthermore, the width "D1" of the joining face at the outer profile thereof is smaller than the width D2 of the end face at the outer profile thereof.

The present invention further provides a supporting structure of a ceramic susceptor. The structure has a ceramic susceptor to be heated and having mounting and back faces, and a ceramic supporting member joined with the back face of the susceptor. The supporting member has an outer wall surface, a joining face joined with the susceptor and an end face opposite to the joining face. A curved part is formed between the outer wall surface and back face, and has a radius of curvature "R" of not smaller than 4 mm and not larger than 25 mm in the longitudinal direction of the supporting member. The width "D1" of the joining face at the outer profile thereof is smaller than the width "D2" of the end face at the outer profile thereof.

The present invention still further provides a ceramic supporting member to be joined with a ceramic susceptor to be heated and having mounting and back faces. The supporting member has an outer wall surface, a joining face joined with the susceptor and an end face opposite to the joining face. A curved part is formed between the outer wall surface and the back face, and has a radius of curvature "R" of not smaller than 4 mm and not larger than 25 mm in the longitudinal direction of the supporting member. The width "D1" of the joining face at the outer profile is smaller than the width D2 of the end face at the outer profile.

According to the above structure, it is possible to reduce thermal stress in the joining portion of the susceptor and supporting member, and to prevent joining defects in the joining face. As a result, even under severe condition that the susceptor is operated at a high temperature or the temperature of the susceptor is rapidly elevated to a high temperature, it is possible to prevent fine cracks or gas leakage in the joining portion of the susceptor and supporting member.

These and other objects, features and advantages of the invention will be appreciated upon reading the following description of the invention when taken in conjunction with the attached drawings, with the understanding that some modifications, variations and changes of the same could be made by the skilled person in the art.

DETAILED DESCRIPTION OF THE INVENTION

The present invention will be described further in detail, referring to the attached drawings.

Figure 1:
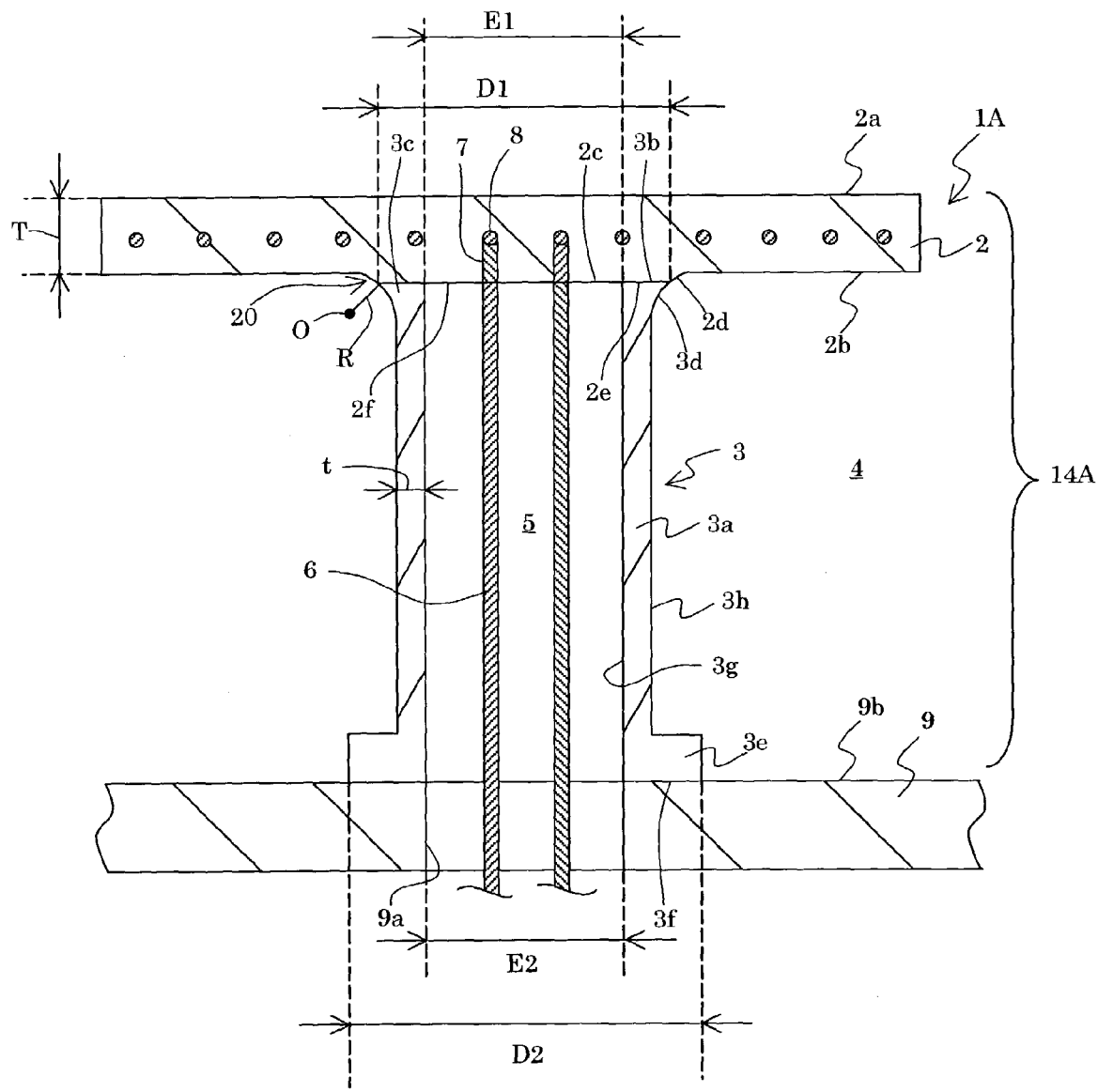
FIG. 1 is a longitudinal sectional view schematically showing a fixing structure according to one embodiment of the present invention.

FIG. 1 is a longitudinal sectional view schematically showing a fixing structure according to one embodiment of the present invention. A supporting structure 14A has a substantially plate-shaped ceramic susceptor 1A, and a supporting member 3 joined with the back face of the susceptor 1A. The susceptor 1A has a substantially plate-shaped substrate 2, a heat resistor 8 embedded in the substrate 2, and terminals 7 connected with the heat resistor 8. The substrate 2 of the susceptor has a flat heating face 2a and a back face 2b opposite to the heating face 2a. A small and disk-shaped ridge or boss 2c is formed on the back face 2b. A curved face 2d is formed around the outer edge of the small ridge 2c. The surface 2e and 2f of the ridge 2c are flat.

The supporting member 3 has a straight tube portion 3a having a shape of cylinder, an end portion 3c on the side of the susceptor and a flange portion 3e on the side of a chamber. The supporting member 3 has an inner wall face 3g elongating straightforwardly in the longitudinal direction of the supporting member. A curved face 3d is formed in the end portion 3c at its outer periphery. The supporting member 3 and susceptor 1A are joined with each other at ring shaped joining faces 3b and 2e.

The end face 3f of the flange portion 3e of the supporting member 3 is fixed onto an inner wall surface 9b of a chamber 9. As a result, an opening 9a of the chamber 9 is communicated with an inner space 5 of the supporting member 3, and the inner space 5 is sealed with respect to an inner space 4 of the chamber 9 to secure the air-tightness. Power supply means 6, for example of a shape of a rod, is connected with the terminals 8.

The curved faces 2d and 3d are continuously formed to form an integral curved part 20, between the outer wall surface 3h of the straight tube portion 3a and the back face 2b of the susceptor 2. The radius of curvature "R" of the curved part 20 is adjusted to a value not smaller than 4 mm and not larger than 25 mm according to the present invention, in a longitudinal section of the supporting member 3. Further, the width "D1" of the joining face 3b of the supporting member 3 is smaller than the width D2 of the end face 3f opposite to the joining face. The advantages will be described below.

It is effective to provide a curved part 20 having "R" of not smaller than 4 mm and not larger than 25 mm in the joining portion of the supporting member 3 and susceptor, for reducing thermal stress in the joining portion.

If the radius of curvature "R" of the curved part 20 is too small, thermal stress applied on the joining face may be increased. It is thus required that the radius of curvature "R" of the curved part is not smaller than 4 mm to reduce the thermal stress. From this viewpoint, the radius of curvature "R" is more preferably not smaller than 7 mm.

It is effective to increase the radius of curvature "R" for further reducing thermal stress in the joining portion of the susceptor and supporting member. If "R" exceeds 20 mm, however, the advantage of reducing thermal stress is not considerable.

When the width D1 of the joining face 3b of the supporting member exceeds the width D2 of the end face 3f on the opposite side, joining defects might be found in some cases in a part of the joining face of the susceptor and supporting member. Such joining defects may contribute to crack formation in the joining portion of the susceptor and supporting member after the susceptor is heated at a high temperature to induce thermal stress in the joining portion.

Figure 2:
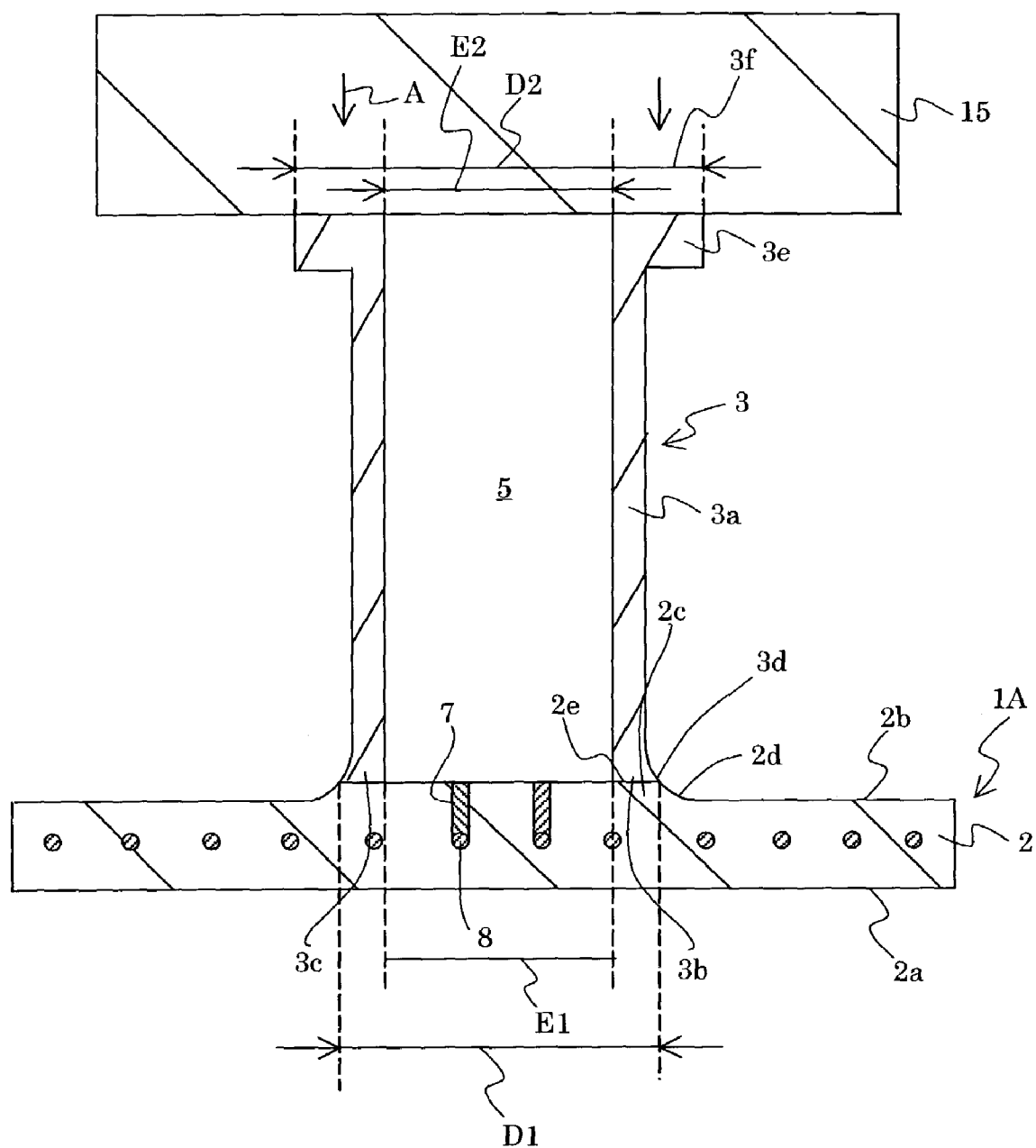
FIG. 2 is a longitudinal sectional view showing a susceptor 1A and supporting member 3 subjected to joining process under pressure.
Figure 3:
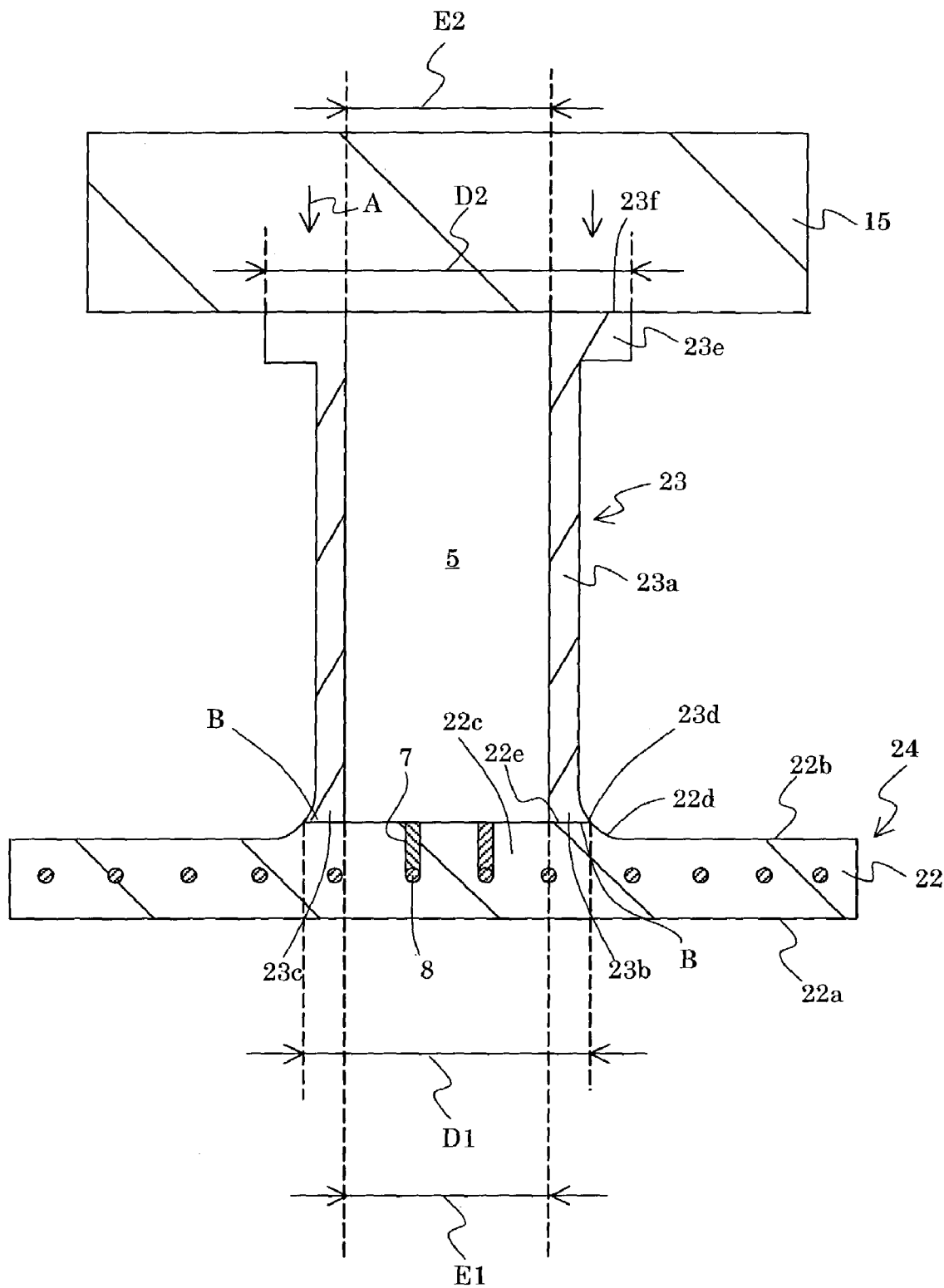
FIG. 3 is a longitudinal sectional view schematically showing a susceptor 24 and supporting member 23 subjected to joining process under pressure, D1 being larger than D2.

The reasons may be considered as follows. The supporting member 3 and susceptor 1A of FIG. 2 are the same as those shown in FIG. 1. In FIG. 3, a supporting member 23 and a susceptor 24 are joined with each other. 22 represents a substrate, 22a represents a heating face, 22c represents a small ridge, 22d and 23d represent curved faces, 22e and 23b represent joining faces, 23a represents a straight tube portion, 23c represents an end portion, 23e represents a flange portion and 23f represents an end face. In FIG. 3, D1 is larger than D2.

Although the method for joining a ceramic susceptor and supporting member is not limited, they are generally joined by applying a pressure thereon as shown in FIGS. 2 and 3. That is, the supporting members 3, 23 are mounted on the back faces 2b, 22b of the susceptor 1A, 24, respectively, so that the joining faces 2e, 22e of the substrates 2, 22 are contacted with the joining faces 3b, 23b of the supporting members 3, 23, respectively. A pressure "A" is applied from the side of the joining faces 3f, 23f of the flange portions 3e, 23e, respectively, to join them. Such pressure may be applied, for example, by mounting a weight 15 on the end faces 3f, 23f, respectively.

In FIG. 2, the width "D1" of the joining face 3b of the supporting member 3 is smaller than the width "D2" of the end face 3f on the opposite side, so that a pressure may be uniformly applied over the whole joining face 3b.

On the other hand, in the supporting structure shown in FIG. 3, it is difficult to apply a sufficient pressure over the whole of the joining face of the supporting member 23 and susceptor 22. In particular, it is difficult to apply a sufficiently high pressure on an outer peripheral region "B" in the joining face 23b so that joining defects may be induced in the region "B". It is considered that the joining defects may be starting points of fracture when thermal stress is induced.

"D1" and "D2" are the widths of the joining and end faces at their outer profiles, respectively. In FIG. 1, the joining face 3b is ring-shaped, and the distance of the inner and outer profiles of the joining face 3b might be defined as a width of the joining face. However, "D1" in the present invention is a width of the joining face 3b at its outer profile and not the distance between the outer and inner profiles. Further, the width of the joining face or end face may be defined as a length of an ideal diagonal line in the joining or end face at its outer profile.

When the outer profile of the joining or end face is circular, the width "D1" or "D2" is therefore a diameter of the outer profile. When the outer profile of the joining or end face is elliptical, the width "D1" or "D2" is a length of the major axis. When the outer profile of the joining or end face is polygonal, the width "D1" or "D2" is a maximum of lengths of the diagonal lines drawn in the polygonal shape.

In a preferred embodiment, the ratio of "D1" to "D2" (D1/D2) is not larger than 1, and more preferably not larger than 0.9. Further, in a preferred embodiment, the difference between D1 and D2 (D2−D1) is not smaller than 0 mm and more preferably not smaller than 3 mm.

On the other hand, as "D1" reduced, the radius of curvature "R" of the curved part tends to be smaller so that the thermal stress in the joining portion of the susceptor and supporting member is increased. For reducing the thermal stress, (D1/D2) is preferably not smaller than 0.3, and more preferably, not smaller than 0.5. Further, (D2−D1) is preferably not larger than 40 mm, and more preferably, not larger than 30 mm.

"D1" is preferably be smaller for preventing joining defects. For reducing "D1," it has been proved that the radius of curvature "R" of the curved part is preferably not larger than 25 mm, and more preferably, not larger than 15 mm.

In a preferred embodiment, the width "E1" of the joining face of the supporting member at its inner profile is not smaller than the width "E2" of the end face of the supporting member at its inner profile. It is thereby possible to uniformly apply a sufficient pressure on the central region of the joining face of the supporting member with ease, when a pressure is applied, for example, as shown in FIG. 2. If "E1" is smaller than "E2", joining defects may be easily induced in the central region of the joining face.

From the viewpoint of preventing the joining defects, "E1" and "E2" are preferably substantially equal with each other. On the other hand, if "E1" is too large, it tends to be difficult to apply a pressure uniformly on the joining face. "E1/E2" is preferably not larger than 1.5 from this viewpoint.

The wall thickness "t" of the supporting member 3 is preferably not larger than 15 mm to reduce thermal conduction from the susceptor 1A through the supporting member 3 to the chamber 9 and to prevent local temperature reduction or cold spots on the susceptor 1A. From this viewpoint, "t" is more preferably not larger than 10 mm.

On the other hand, the supporting member 3 having a wall thickness "t" of smaller than 1 mm is susceptible to fracture. The wall thickness "t" is thus adjusted to a value not smaller than 1 mm in the invention. From the viewpoint of avoiding the fracture of the supporting member, "t" is preferably not smaller than 1.5 mm.

In a preferred embodiment, the supporting member has a straight tube portion 3a. The thickness of the portion 3a is the maximum thickness of the supporting member in this case.

As described above, the wall thickness "t" of the supporting member 3 is reduced to prevent conduction of heat through the supporting member 3. It is proved that, in this case, thermal stress in the joining portion of the supporting member 3 and susceptor 1A may be increased to induce fine cracks and gas leakage in the joining portion. For solving the problem, it is effective to provide a curved part 20 between the outer wall surface 3h of the supporting member 3 and back face 2b of the susceptor 1A. It is proved that the thermal stress may be reduced considerably by providing a continuous and integral curved part, rather than by providing a plurality of curved parts separate from each other in a stepwise manner between the outer wall surface 3h and back face 2b.

The thickness "T" of the ceramic susceptor is preferably not larger than 50 mm for reducing thermal stress in the joining portion of the susceptor and supporting member. The thickness "T" is preferably not smaller than 3 mm for providing a mechanical strength for proper handling to the susceptor.

Figure 4:
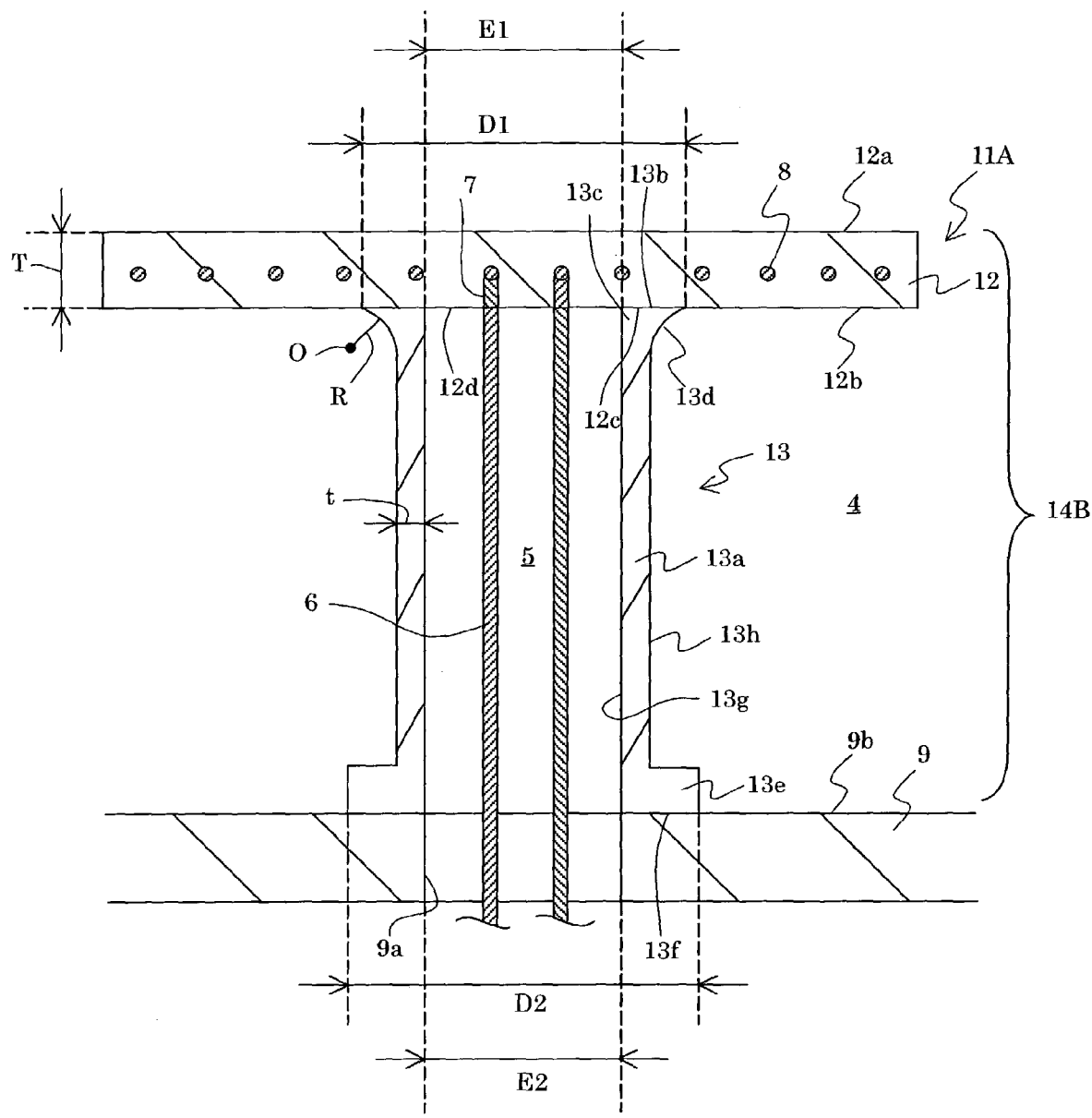
FIG. 4 is a longitudinal sectional view schematically showing a fixing structure according to another embodiment of the present invention.

FIG. 4 is a longitudinal sectional view schematically showing fixing and supporting structures of a susceptor, according to another embodiment of the present invention. In FIG. 4, parts and dimensions already shown in FIGS. 1 and 2 are indicated by the same numerals and their explanation may be omitted.

The supporting structure 14B shown in FIG. 4 has a substantially plate-shaped susceptor 11A and a supporting member 13 joined with the back face of the susceptor 11A. The susceptor 11A has a substantially plate-shaped substrate 12, a heat resistor 8 embedded in the substrate 12 and terminals 7 connected with the heat resistor 8. The substrate 12 has a flat heating face 12a, and a back face 12b opposite to the heating face 12a. In the present embodiment, the small ridge 2c (refer to FIG. 1) is not formed on the side of the back face 12b.

The supporting member 13 has a straight tube portion 13a having a shape of a cylinder, an end portion 13c on the side of the susceptor, and a flange portion 13e on the side of a chamber. The supporting member 13 has an inner wall surface 13g extending straightforwardly in the longitudinal direction of the supporting member. A curved part 13d is formed in the end portion 13g at its outer periphery. The supporting member 13 and susceptor 11A are joined with each other at ring-shaped joining faces 13b and 12c. 12d represents an exposed face to the inner space 5. The flange portion 13e of the supporting member 13 has end face 13f fixed onto the inner wall surface 9b of the chamber 9.

An integral and continuously formed curved part 13d is provided between the outer wall surface 13h of the supporting member 13 and the back face 12c of the susceptor 12. The radius of curvature "R" of the curved part 13d is made not smaller than 4 mm and not larger than 25 mm and "D1" is larger than "D2" according to the present invention, in a longitudinal section of the supporting member 13.

An integral and continuous curved part is formed between the outer wall surface of the supporting member and the back face of the susceptor, according to a preferred embodiment. In the embodiment, one curved face may be provided as the integral curved part continuously formed. One curved face is defined as a curved face having a common center of curvature and radius of curvature, in the longitudinal section. Alternatively, a plurality of curved faces may be provided continuously to form the integral curved part. In other words, the curved part includes a plurality of curved faces in which at least one of the center of curvature and radius of curvature is different with each other. A plurality of the curved faces are continuously formed.

The embodiment does not include cases where a plurality of curved faces and a flat face, a groove or a ridge are formed in a curved part and the adjacent curved faces are divided by the flat face, groove or ridge.

The present invention, however, includes the case where a plurality of curved faces are formed in a curved part, as long as the curved faces are continuously formed to provide an integral curved part as a whole. For example, a plurality of curved faces having a common center of curvature and different radii of curvature may be continuously formed. Alternatively, a plurality of curved faces having different centers of curvature and a common radius of curvature may be continuously formed. Further, a plurality of curved faces having different centers of curvature and different radii of curvature may be continuously formed.

Figure 5:
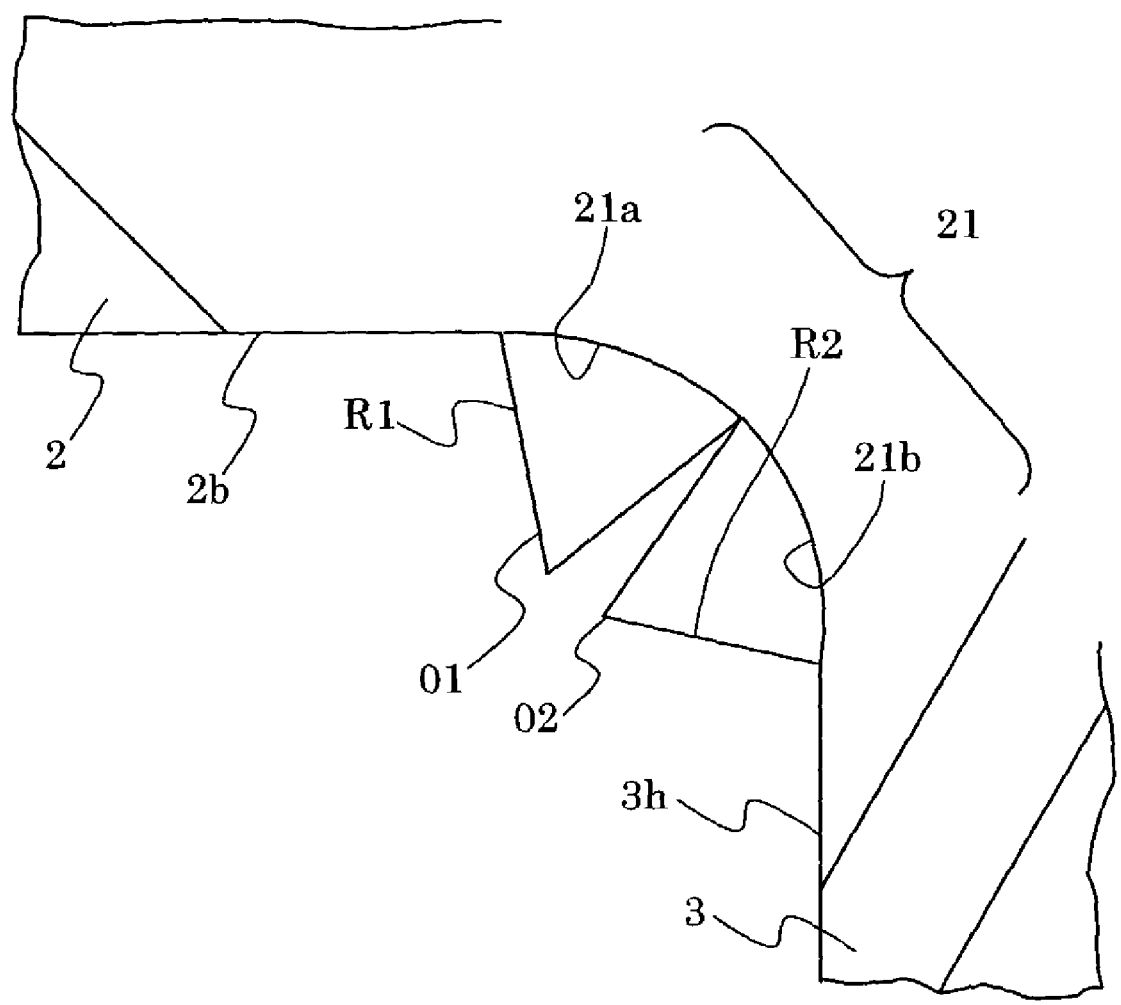
FIG. 5 is a diagram schematically showing the shape of a curved part in the joining portion of a susceptor and supporting member.

For example, in the embodiment schematically shown in FIG. 5, a curved part 21 is composed of curved faces 21a and 21b which are continuously formed. The curved face 21a has a center "O1" of curvature and radius "R1" of curvature. The curved face 21b has a center "O2" of curvature and radius "R2" of curvature.

When a plurality of curved faces having different centers of curvature are continuously formed, the distance between the different centers of curvature is preferably not larger than 10 mm, and more preferably, not larger than 5 mm. When a plurality of curved faces having different radii of curvature are continuously formed, the difference between the different radii of curvature is preferably not larger than 10 mm, and more preferably, not larger than 5 mm.

The materials of the susceptor may be selected depending on the use and are not particularly limited. The material is preferably a ceramic having corrosion resistance against halogen-series corrosive gases, such as aluminum nitride or dense alumina. Aluminum nitride ceramics or alumina having a relative density of not less than 95% is particularly preferred. A functional part such as a heat resistor, an electrode for electrostatic chuck or an electrode for generating plasma may be embedded or provided in the susceptor.

The susceptor may be heated by a heating source that is not limited. The susceptor includes susceptors heated by an outer heat source (for example infrared lamp) and an inner heat source (for example, a heating element embedded in the susceptor). The shape of the ceramic constituting the supporting member is not limited and may be, for example, an elongate body made of a plate-shaped ceramic material. The shape is preferably a tube.

The material for the supporting member is not particularly limited. The material is preferably a ceramic having corrosion resistance against halogen-series corrosive gases, and is more preferably aluminum nitride or dense alumina.

The method of joining the susceptor and supporting member is not limited and includes solid phase welding, solid-liquid-phase welding, soldering and mechanical fixing such as screwing. The solid-liquid phase welding is described in a U.S. Pat. No. 6,261,708 (Japanese patent publication 273, 370A/1998).

In a preferred embodiment, the susceptor and supporting member are joined with solid phase welding. In solid phase welding, liquid containing a sintering aid is applied on the joining face. The sintering aid is effective to at least one ceramic constituting the susceptor and that constituting the supporting member. The susceptor and supporting member are laminated to obtain a laminated body. Pressure is applied on the laminated body in a direction that is perpendicular to the joining face while the laminated body is heated at a temperature slightly lower than the sintering temperature. Particularly preferably, the solid phase welding is performed as follows.

The precursor compound includes organic and inorganic compounds having an aluminum-nitrogen bond. The organic compound includes an addition product of $R_3Al$ and ammonia or ethylene diamine (R represents methyl, ethyl, propyl or butyl group), a condensation product of $AlH_3$ and $NH_3$, and polyalkyl imino alum [(HAlNR)n]. Polyalkyl imino alum is a polymer of alkyl imino alum (HAlNR: R represents an alkyl group) and has so-called basket type structure. For producing this, a hydride of aluminum is reacted with an amine or a hydrochloride of an amine. When "R" represents ethyl group, an octamer [$(HAlNR)_8$: "R" represents ethyl group)] is mainly produced. When "R" represents isopropyl group, a hexamer [$(HAlNR)_6$: "R" represents isopropyl group)] is mainly produced. When "R" represents methyl group, insoluble polymer may be easily generated.

The decomposition temperature of the precursor compound having aluminum-nitrogen bond may preferably be not higher than 1600° C. The joining process may preferably be performed in an atmosphere of an inert gas such as argon or the like and a reducing atmosphere such as ammonia-nitrogen. It is preferred to use an atmosphere of ammonia— as an inert gas for removing carbon generated from the precursor compound having aluminum-nitrogen bond during the decomposition of the compound.

It is preferred to apply a pressure in the direction perpendicular to each of the joining faces for further improving the joining strength. The effects of applying a pressure may be observed substantially at a pressure of 0.1 kg/cm². The pressure may preferably be not higher than 500 kg/cm².

A compound having silicon-nitrogen bond may be used in addition to the compound having aluminum-nitrogen bond.

A solution containing a sintering aid provided between the joining face of the supporting member and the back face of the susceptor and then heat treated. The sintering aid is effective to at least one ceramic constituting the susceptor and that constituting the supporting member. For example, when the ceramic is aluminum nitride or silicon nitride, the sintering aid is preferably one or more compounds selected from the group consisting of compounds of yttrium, ytterbium and an alkaline earth metal. A compound of yttrium is most preferred.

Sintering aids such as a chloride, sulfate, phosphate, nitrate and carbonate are easily wettable and handled. For example, aqueous solution of yttrium chloride, a hydrate of yttrium chloride, yttrium sulfate, yttrium acetate are preferred.

The joining process may be performed by a heat treatment at ambient temperature, hot pressing, plasma activated sintering or local heating method with laser radiation.

EXAMPLES

Experiment A

A supporting structure 14A shown in FIG. 1 was produced. As a susceptor 1A, a disk of aluminum nitride sintered body having a diameter ø of 300 mm and a thickness of 10 mm was used. The supporting member 3 was formed of a ceramic plate. The length of the supporting member 3 was 70 mm. The supporting member 3 and susceptor 1A were set as shown in FIG. 2 or 3 and joined with each other by means of solid phase welding. "D1" and "D2" were changed as shown in table 1. "t" was 2.5 mm, "T" was 10 mm and "R" was 10 mm. The following conditions were applied for the solid phase welding.
Pressure of atmosphere in a furnace: 0.5 kg/cm² G
Maximum temperature: 2000° C.
Holding time at a maximum temperature: 60 minutes
Pressure during the joining process: 0.5 to 1.0 kg/cm²
Joining material: solution containing yttrium and acetic acid as main components The supporting structure 14A was contained in a chamber for evaluation and set on a fixing jig. Nitrogen atmosphere was introduced in the chamber at 10 Torr. Cooling water at 30° C. was supplied into the fixing jig. Electric power was supplied to the heating element in the susceptor so that the temperature on the heating face reached about 600° C. at a rate of 100° C./minute. After the temperature on the heating face reached about 600° C., the operation was continued. During the operation, power supply data and gas leakage rate from the joining portion of the supporting member 3 and susceptor were monitored. Further, the temperature distribution of the heating face was measured by means of a radiation thermometer.

The temperature on the heating face was reduced from 600° C. to room temperature. After that, the presence of fracture on the appearances of the susceptor and supporting member was observed. Further, the presence of fine cracks was measured, by fluorescence crack detection method, in the joining portion of the susceptor and supporting member.

TABLE 1

| D1 (mm) | D2 (mm) | Presence of Fracture on Appearance | Presence of Fine cracks by fluorescence crack detection | Gas leakage rate From joining portion Of susceptor and Supporting member (sccm) |
|---|---|---|---|---|
| 40 | 50 | None | None | $2 \times 10^{-8}$ |
| 40 | 45 | None | None | $8 \times 10^{-7}$ |
| 40 | 40 | None | Found | $5 \times 10^{-3}$ |
| 45 | 40 | None | Found | 60 |

As described above, the inventive structure can realize, for the first time, rapid temperature rise to a high temperature, for example of 600° C., by means of relatively simple structure.

Experiment B

A supporting structure shown in FIG. 1 was produced according to the same procedure described in Experiment A, except that "D1" was set at 40 mm, "D2" 50 mm, "t" 2.5 mm and "T" 10 mm.

The supporting member 3 and chamber 9 were fixed by screws. The supporting member 3 and chamber 9 were sealed with an O-ring made of fluorine rubber.

Figure 6:
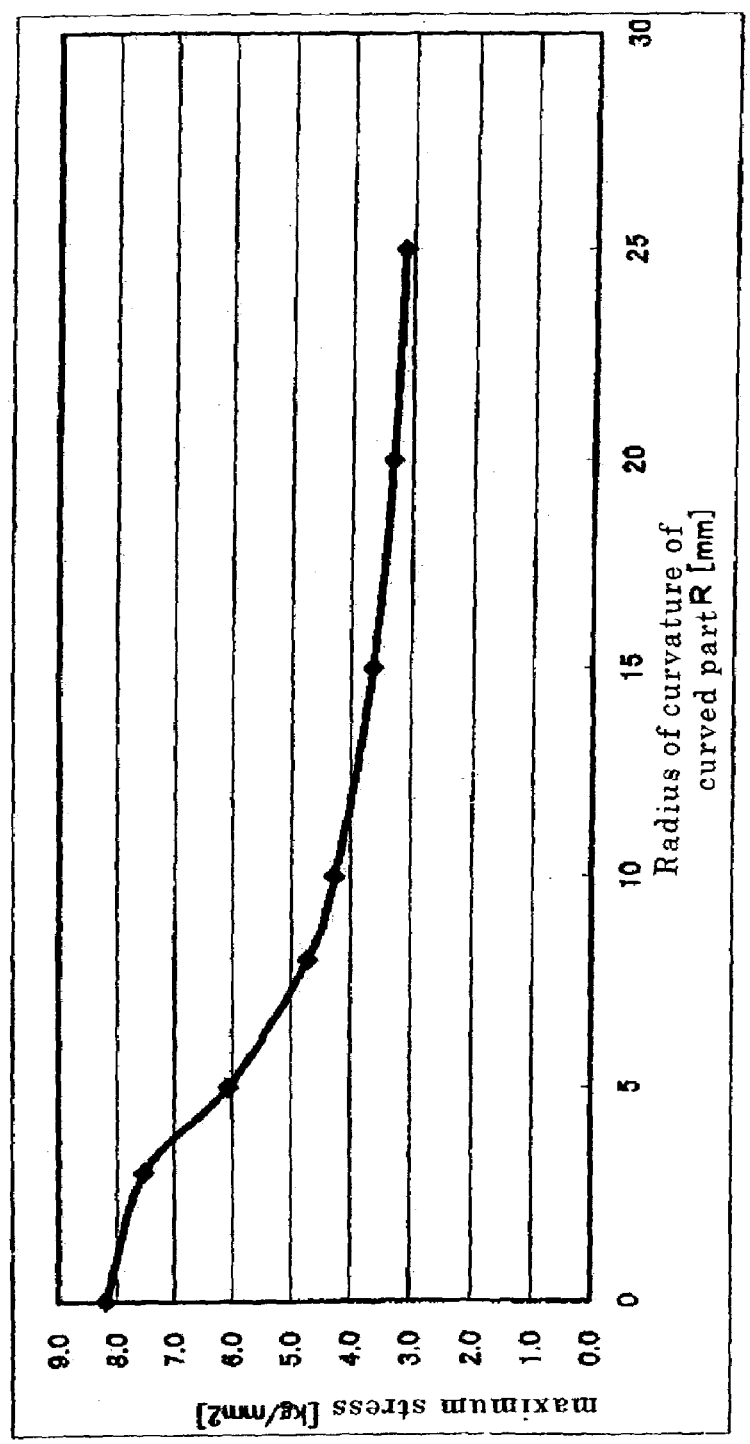
FIG. 6 is a graph showing relationship of a radius of curvature "R" of the curved part and maximum stress in the supporting member.

Simulation was performed at this stage under the provision that the heating face 2a of the susceptor 1A was heated to a temperature of about 600° C. and the temperature at the joining portion of the chamber 9 and supporting member 3 was maintained at about 150° C. The radius of curvature "R" was changed as shown in FIG. 6 and inner stress in the supporting member 3 was calculated over the whole of the supporting member 3, so that the maximum stress was obtained. The relationship between "R" and maximum stress was shown in FIG. 6.

As can be seen from the results, it is especially effective to increase "R" to a value not smaller than 4.0 mm for reducing the maximum stress in the supporting member 3. "R" is more preferably not smaller than 7 mm for further reducing the maximum stress in the supporting member 3. When "R" is larger than 20 mm, an increase of "R" does not substantially contribute to the reduction of the maximum stress.

Particularly, under the above conditions, the maximum stress of not larger than 6.0 kg/mm² have not been realized. The inventive structure can realize such extremely small maximum stress, which have not been realized, by means of relatively simple design as shown in FIG. 1. The invention is thus useful in the technical field.

Experiment C

Figure 7:
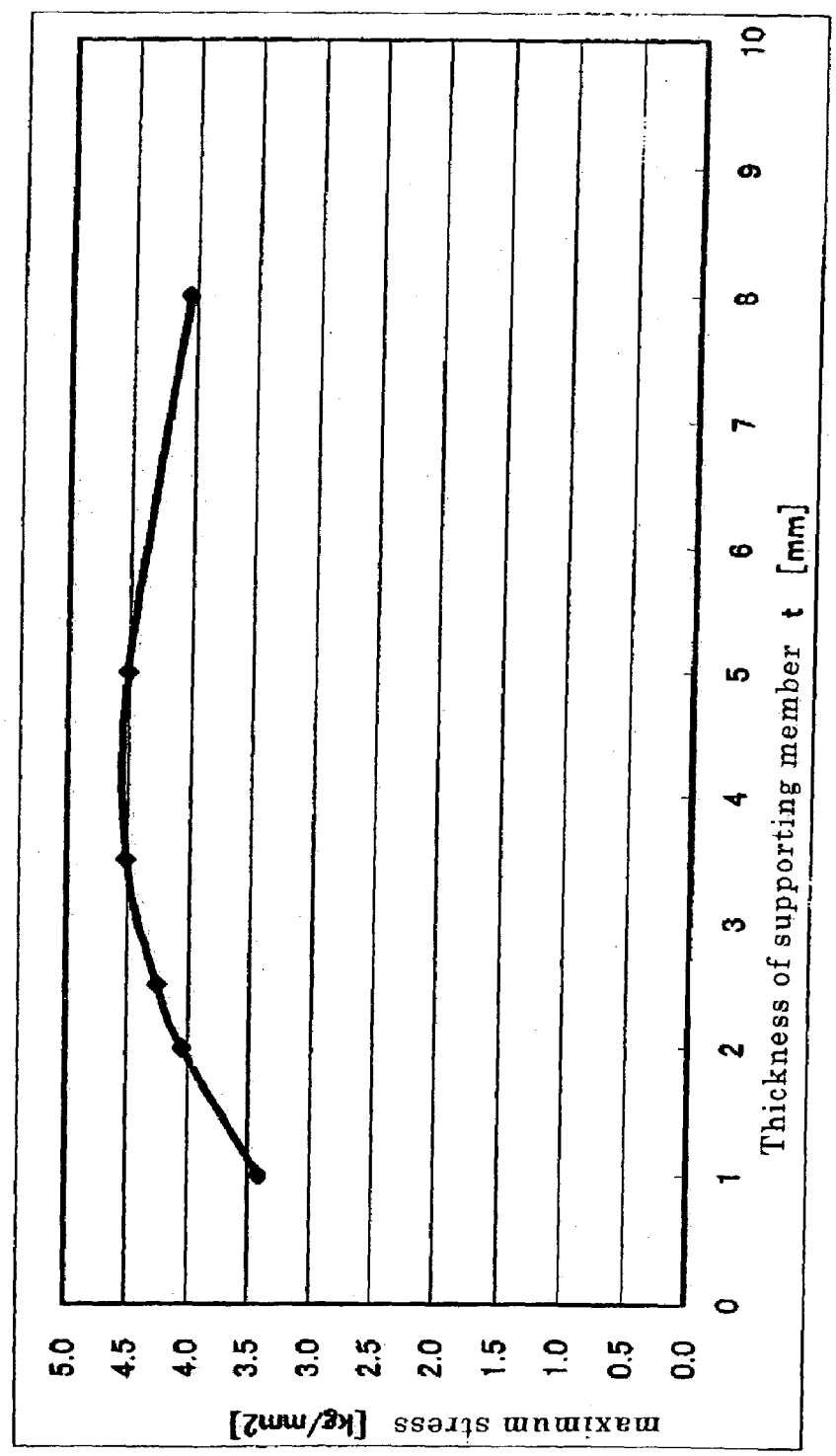
FIG. 7 is a graph showing relationship of a wall thickness "t" of the supporting member and maximum stress in the supporting member.

The simulation of maximum stress in the supporting member 3 was calculated according to the same process as Experiment B, except for the following conditions. That is, "D1" was set as 40 mm, "D2" 50 mm, "T" 10 mm, and "R" 10 mm. The wall thickness "t" of the supporting member 3 was changed as shown in FIG. 7, and inner stress in the supporting member 3 was calculated over the whole of the supporting member, so that the maximum stress was obtained. The relationship between "t" and maximum stress was shown in FIG. 7.

As a result, when the wall thickness "t" is not smaller than 5 mm, it is proved that the maximum stress is gradually reduced. From the viewpoint of reducing the maximum stress, the wall thickness "t" of not larger than 15 mm is sufficient. However, the wall thickness "t" is more preferably not larger than 3 mm or not smaller than 6 mm for further reducing the maximum stress.

As described above, according to the present invention, thermal stress in the joining portion of a ceramic susceptor and supporting member may be reduced and joining defects in the joining face may be prevented. It is thus possible to provide a supporting structure so that fine cracks or gas leakage in the joining portion may be prevented.

The present invention has been explained referring to the preferred embodiments. However, the present invention is not limited to the illustrated embodiments which are given by way of examples only, and may be carried out in various modes without departing from the scope of the invention.

The invention claimed is:

1. A fixing structure of a ceramic susceptor, said fixing structure comprising:
   a ceramic susceptor to be heated, said ceramic susceptor having a mounting face and a back face,
   a ceramic supporting member joined with said back face of said susceptor and a chamber wall fixing said supporting member,
   wherein said ceramic supporting member comprises an outer wall surface, a joining face joined with said ceramic susceptor, an end face opposing said joining face, and a curved part formed between said outer wall surface of said ceramic supporting member and said back face of said susceptor,
   wherein said curved part has a radius of curvature R in a range of 4 mm to 25 mm in the longitudinal direction of said ceramic supporting member, wherein said curved part is concave with respect to said outer wall surface of said ceramic supporting member, and wherein a center of curvature of said curved part is located outside said outerwall surface of said ceramic supporting member; and
   wherein a width D1 of said joining face at an outer profile thereof is less than width D2 of said end face at an outer profile thereof.

2. The fixing structure of claim 1, wherein said end face of said ceramic supporting member contacts said chamber.

3. The fixing structure of claim 1, wherein said ceramic supporting member has a minimum wall thickness t in a range of 1 mm to 15 mm.

4. The fixing structure of claim 1, wherein said ceramic susceptor has a thickness T in a range of 3 mm to 50 mm.

5. The fixing structure of claim 1, wherein said ceramic susceptor is joined with said ceramic supporting member with an applied pressure.

6. The fixing structure of claim 1, wherein said joining face has an inner profile, said end face has an inner profile, and a width E1 of said joining face at said inner profile thereof is not smaller than a width E2 of said end face at said inner profile thereof.

7. The fixing structure of claim 1, wherein said ceramic supporting member is directly joined to said susceptor.

8. A supporting structure of a ceramic susceptor, said structure comprising:
   a ceramic susceptor to be heated, said ceramic susceptor having mounting face and a back face, and a ceramic supporting member joined with said back face of said susceptor, wherein said ceramic supporting member comprises has an outer wall surface, a joining face joined with said ceramic susceptor, an end face opposing said joining face, a curved part formed between said outer wall surface of said supporting member and said back face of said susceptor, wherein said curved part has a radius of curvature R in a range of 4 mm to 25 mm in the longitudinal direction of said ceramic supporting member, wherein said curved part is concave with respect to said outer wall surface of said ceramic supporting member, and wherein a center of curvature of said curved part is located outside said outerwall surface of said ceramic supporting member; and wherein a width D1 of said joining face at an outer profile thereof is smaller than width D2 of said end face at an outer profile thereof.

9. The supporting structure of claim 8, wherein said ceramic supporting member has a minimum wall thickness t in a range of 1 mm to 15 mm.

10. The supporting structure of claim 8, wherein said ceramic susceptor has a thickness T in a range of 3 mm to 50 mm.

11. The supporting structure of claim 8, wherein said ceramic susceptor is joined with said supporting member with an applied pressure.

12. The supporting structure of claim 8, wherein said joining face has an inner profile, said end face has an inner profile, and a width E1 of said joining face at said inner profile thereof is not smaller than a width E2 of said end face at said inner profile thereof.

13. The supporting structure of claim 8, wherein said ceramic supporting member is directly joined to said susceptor.

14. A ceramic supporting member to be joined with a ceramic susceptor to be heated and having a mounting face and a back face, said supporting member comprising:

an outer wall surface, a joining face to be joined with said ceramic susceptor, and an end face opposing said joining face, wherein a curved part is formed between said outer wall surface and said joining face of said ceramic supporting member, said curved part having a radius of curvature R in a range of 4 mm to 25 mm in the longitudinal direction of said ceramic supporting member, wherein said curved part is concave with respect to said outer wall surface of said ceramic supporting member, and wherein a center of curvature of said curved part is located outside said outerwall surface of said ceramic supporting member; and wherein a width D1 of said joining face at an outer profile thereof is smaller than width D2 of said end face at an outer profile thereof.

15. The ceramic supporting member of claim 14, wherein a minimum wall thickness t of said ceramic supporting member is in a range of 1 mm to 15 mm.

16. The ceramic supporting member of claim 14, wherein said joining face has an inner profile, said end face has an inner profile, and a width E1 of said joining face at a inner profile thereof is not smaller than a width E2 of said end face at said inner profile thereof.

* * * * *

UNITED STATES PATENT AND TRADEMARK OFFICE
CERTIFICATE OF CORRECTION

PATENT NO. : 7,011,712 B2
APPLICATION NO. : 10/395536
DATED : March 14, 2006
INVENTOR(S) : Kazuaki Yamaguchi and Yoshinobu Goto It is certified that error appears in the above-identified patent and that said Letters Patent is hereby corrected as shown below:

Column 8,
Line 15, add -- is -- before "provided".

Column 10,
Line 45, add -- a -- before "width".
Line 67, add -- a -- before "mounting".

Column 11,
Line 4, delete "has" after "comprises".
Line 7, add -- and -- after "face,".
Line 8, add -- ceramic -- before "supporting".
Line 19, add -- a -- after "than".

Column 12,
Line 21, add -- a -- after "than".
Line 28, change "a" (second occurrence) to -- said --.

Signed and Sealed this

Twenty-seventh Day of June, 2006

JON W. DUDAS
*Director of the United States Patent and Trademark Office*